(12) United States Patent
Cheramy et al.

(10) Patent No.: US 12,050,180 B2
(45) Date of Patent: Jul. 30, 2024

(54) SOLUTION GLOW DISCHARGE PLASMA CHAMBER WITH VENTILATION

(71) Applicant: 2 S Water Incorporated, Edmonton (CA)

(72) Inventors: Joseph John Cheramy, Edmonton (CA); Anders Jaques Palmgren, Edmonton (CA); Avro Anthony Sargeaunt Nelson, Esquimalt (CA); Neil Wallace Johnson, Edmonton (CA); Howard Andrew Suissa, Vegreville (CA); Anthony Brent Nelson, Edmonton (CA)

(73) Assignee: 2S Water Incorporated, Edmonton (CA)

( * ) Notice: Subject to any disclaimer, the term of this patent is extended or adjusted under 35 U.S.C. 154(b) by 429 days.

(21) Appl. No.: 17/406,603

(22) Filed: Aug. 19, 2021

(65) Prior Publication Data
US 2023/0059048 A1 Feb. 23, 2023

(51) Int. Cl.
*G01N 21/67* (2006.01)
*G01N 21/69* (2006.01)
*H01J 37/32* (2006.01)

(52) U.S. Cl.
CPC ............ *G01N 21/67* (2013.01); *G01N 21/69* (2013.01); *H01J 37/32018* (2013.01)

(58) Field of Classification Search
CPC .... G01N 21/67; G01N 21/69; H01J 37/32018
See application file for complete search history.

(56) References Cited

U.S. PATENT DOCUMENTS 11,598,727 B1 * 3/2023 Cheramy ................ H01J 61/64

* cited by examiner

*Primary Examiner* — Nicole M Ippolito
(74) *Attorney, Agent, or Firm* — Michael D. Eisenberg (57) ABSTRACT

A plasma chamber for containing a solution electrode glow discharge (SEGD) apparatus, the plasma chamber comprising a hollow body and a ventilation unit. The hollow body is configured to enclose a plasma generated between a solid electrode and a solution electrode, the hollow body comprising an inlet opening, an outlet opening, and at least one viewing port for letting light generated from the plasma leave the hollow body. The ventilation unit is configured to move air from outside the hollow body into the inlet, through a portion of the hollow body located between the viewing port and a gap between the solid electrode and the solution electrode, and out of hollow body from the outlet, thereby creating an air curtain for removal from an optical path between the plasma and the viewing port of at least some vapor created by vaporization of liquid in the plasma.

8 Claims, 11 Drawing Sheets

Fig. 1
(General Art)

Fig. 2
(General Art)

Fig. 3
(General Art)

SOLUTION GLOW DISCHARGE PLASMA CHAMBER WITH VENTILATION

TECHNICAL FIELD

The present invention, in some embodiments thereof, relates to analysis of materials in a liquid by solution electrode glow discharge (SEGD).

BACKGROUND OF THE INVENTION

Figure 1:
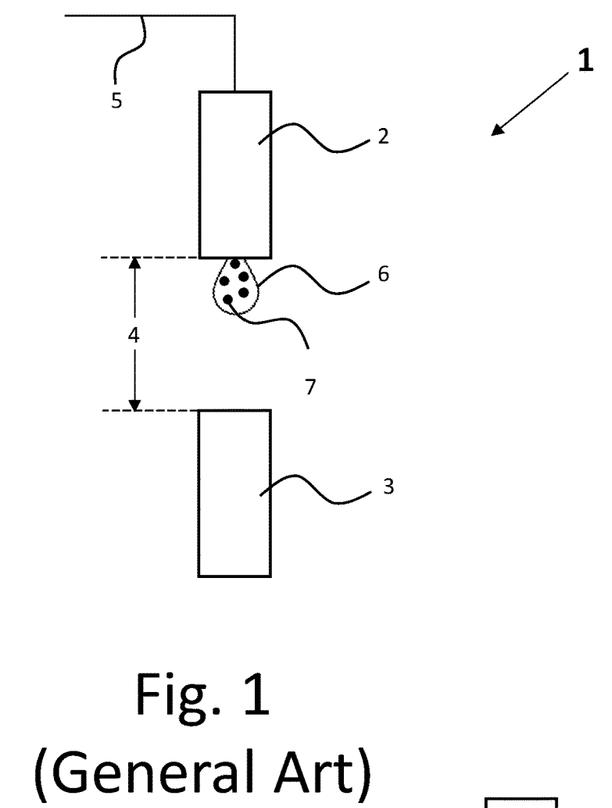
FIGS. 1 and 2 are schematic drawings of a SEGD apparatus, as known in the general art.
Figure 2:
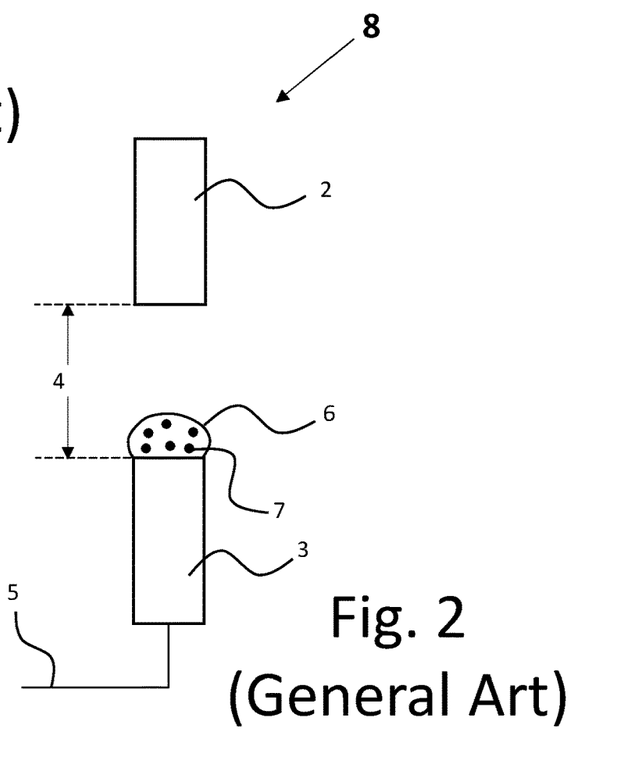

As seen in FIGS. 1 and 2, a Solution Electrode Glow Discharge (SEGD) apparatus generates a plasma in gap 4 between two electrodes 2 and 3. If the first electrode 2 is an anode, the second electrode 3 is a cathode. If the first electrode 2 is a cathode, the second electrode 3 is an anode. One of the electrodes is a solid electrode, while the other electrode is a solution electrode joined to a liquid line 5, such that a liquid 6 is electrically connected to the solution electrode joined to the liquid line 5. This causes the liquid to become electrically charged by the solution electrode. The liquid 6 contains materials 7 (which may be contaminants, solutes, or any other material in the liquid) and the liquid 6 and its materials 7 are released in the gap 4 between the electrodes 2 and 3 and may overflow outside the gap 4 and pool near the electrodes. A glow discharge forms around the cathode and covers the cathode. The liquid 6 and materials 7 are converted directly into plasma upon exit from the liquid line 5. The heat generated by the plasma (and Joule heating) can generate vapor from any pooling or extra liquid. Droplets are likely very quickly formed before complete desolvation. Generally, this is referred to as sputtering. The energy put into the system causes the energy of the materials 7 from the solution to undergo electronic transitions, as the electrons in the current bump electrons out of their orbit in the materials 7. When the electron returns to the orbit of the atom of the material 7, the electron throws off a photon, emitting light. Spectroscopic analysis of the emitted light can be used to determine which materials 7 are present in the liquid 6.

In the example of FIG. 1, the liquid is emitted from the first (top) electrode 2, while in the example of FIG. 2, the liquid is emitted from the second (bottom) electrode 3.

Figure 3:
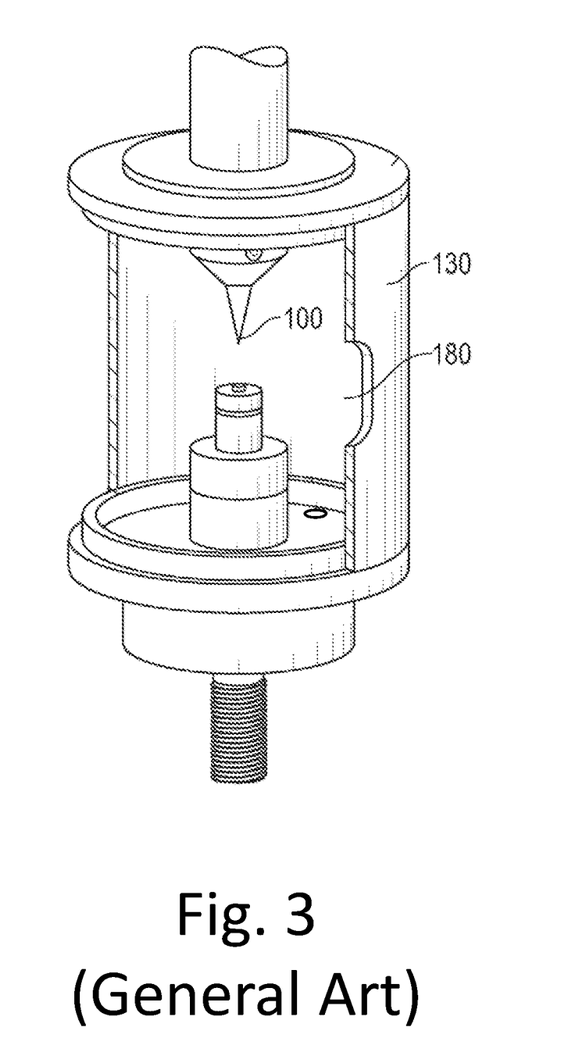
FIG. 3 illustrates a hollow body surrounding the SCGD apparatus as known in the general art, the hollow body having an aperture for purging atmospheric gases.

As seen in FIG. 3, International Patent Publication WO 2019/068191 relates to a device and method to reduce molecular background emission and to increase matrix management in solution cathode glow discharge (SCGD). A purging device for purging atmospheric gases from a solution cathode glow discharge (SCGD) apparatus, comprising a hollow body (tube 130) that encloses a plasma generated between a solid anode 100 and a solution cathode, wherein the body comprises at least one opening 180 for release of the vapor generated by the plasma.

BRIEF SUMMARY OF EMBODIMENTS OF THE INVENTION

An aspect of some embodiments of the present invention relates to a plasma chamber for containing a solution electrode glow discharge (SEGD) apparatus, the plasma chamber comprising a hollow body and a ventilation unit. The hollow body is configured to enclose a plasma generated between a solid electrode and a solution electrode, the hollow body comprising an inlet opening, an outlet opening, and at least one viewing port for letting light generated from the plasma leave the hollow body. The ventilation unit is configured to move air from outside the hollow body into the inlet, through a portion of the hollow body located between the viewing port and a gap between the solid electrode and the solution electrode, and out of hollow body from the outlet, thereby creating an air curtain for removal from an optical path between the plasma and the viewing port of at least some vapor created by vaporization of liquid in the plasma.

In a variant, an internal portion of the hollow body comprises a light absorbing material.

In another variant, one of the inlet opening and the outlet is above the observation port while another of the inlet opening and the outlet opening is below the observation port.

In yet another variant, the observation port comprises a panel that is transparent to the light generated by the plasma.

In some embodiments of the present invention, the plasma chamber comprises a lens at or near the viewing port, the lens being configured to collect light from the plasma and direct the light onto a light receiving unit. The ventilation unit creates the air curtain to divert from the lens at least some liquid droplets thrown out of the plasma toward the lens, thereby protecting the lens from splatter.

In a variant, the lens fully covers the viewing port.

In another variant, the plasma chamber comprises a holder unit configured to hold the light receiving unit at a predetermined distance from the lens parallel to a focal axis of the lens, wherein at least one of the lens and the light receiving unit is movable with respect to the other, perpendicularly to the focal axis of the lens and parallel to an axis of the gap between the solid electrode and the solution electrode.

Optionally, at least one of the lens and the light receiving unit is further movable with respect to the other, in a direction parallel of the focal axis of the lens.

In yet another variant, the plasma chamber comprises the light receiving unit.

In a further variant, the light receiving unit comprises a fiber optic cable configured to receive the light from the lens and to direct the light to a spectrometer for analysis.

In yet a further variant, the light receiving unit comprises a spectrometer configured to receive and analyze the light from the lens.

In a variant, the plasma chamber comprises one or more stepper motors configured to move the holder.

In another variant, the holder is reinforced to decrease vibrational variations in a position of the light receiving unit relative a center of the plasma.

Another aspect of some embodiments of the present invention relates to a solution electrode glow discharge (SEGD) apparatus comprising a solution electrode, a solid electrode and a plasma chamber. The plasma chamber includes a hollow body and a ventilation unit. The hollow body is configured to enclose a plasma generated between the solid electrode and the solution electrode, the hollow body comprising an inlet opening, an outlet opening, and at least one viewing port for letting light generated from the plasma leave the hollow body. The ventilation unit is configured to move air from outside the hollow body into the inlet, through a portion of the hollow body located between the viewing port and a gap between the solid electrode and the solution electrode, and out of hollow body from the outlet, thereby creating an air curtain for removal from an optical path between the plasma and the viewing port of at least some vapor created by vaporization of liquid.

In a variant, the plasma chamber comprises a lens at or near the viewing port, the lens being configured to collect light from the plasma and direct the light onto a light receiving unit. The ventilation unit creates the air curtain to divert from the lens at least some liquid droplets thrown out of the plasma toward the lens, thereby protecting the lens from splatter.

In a variant, the lens fully covers the viewing port.

In another variant, the solution electrode glow discharge (SEGD) apparatus comprises a holder unit configured to hold the light receiving unit at a predetermined distance from the lens parallel to a focal axis of the lens, wherein at least one of the lens and the light receiving unit is movable with respect to the other, perpendicularly to the focal axis of the lens and parallel to an axis of the gap between the solid electrode and the solution electrode.

In yet another variant, at least one of the lens and the light receiving unit is movable with respect to the other in a direction parallel to the focal axis of the lens.

Other features and aspects of the invention will become apparent from the following detailed description, taken in conjunction with the accompanying drawings, which illustrate, by way of example, the features in accordance with embodiments of the invention. The summary is not intended to limit the scope of the invention, which is defined solely by the claims attached hereto.

BRIEF DESCRIPTION OF THE DRAWINGS

The present invention, in accordance with one or more various embodiments, is described in detail with reference to the following figures. The drawings are provided for purposes of illustration only and merely depict typical or example embodiments of the invention. These drawings are provided to facilitate the reader's understanding of the invention and shall not be considered limiting of the breadth, scope, or applicability of the invention. It should be noted that for clarity and ease of illustration these drawings are not necessarily made to scale.

Some of the figures included herein illustrate various embodiments of the invention from different viewing angles. Although the accompanying descriptive text may refer to such views as "top," "bottom" or "side" views, such references are merely descriptive and do not imply or require that the invention be implemented or used in a particular spatial orientation unless explicitly stated otherwise.

The figures are not intended to be exhaustive or to limit the invention to the precise form disclosed. It should be understood that the invention can be practiced with modification and alteration, and that the invention be limited only by the claims and the equivalents thereof.

DETAILED DESCRIPTION OF THE EMBODIMENTS OF THE INVENTION

From time-to-time, the present invention is described herein in terms of example environments. Description in terms of these environments is provided to allow the various features and embodiments of the invention to be portrayed in the context of an exemplary application. After reading this description, it will become apparent to one of ordinary skill in the art how the invention can be implemented in different and alternative environments.

Unless defined otherwise, all technical and scientific terms used herein have the same meaning as is commonly understood by one of ordinary skill in the art to which this invention belongs. All patents, applications, published applications and other publications referred to herein are incorporated by reference in their entirety. If a definition set forth in this section is contrary to or otherwise inconsistent with a definition set forth in applications, published applications and other publications that are herein incorporated by reference, the definition set forth in this document prevails over the definition that is incorporated herein by reference.

Vapor of the liquid is created in the plasma. The vapor and liquid droplets therein may interfere with light created in the plasma as the light travels from the plasma to a light collector unit, obstructing the light's path and reducing the effectiveness of the spectroscopic analysis. Therefore, a first aspect of the present invention provides a plasma chamber with a ventilation unit configured to create an air curtain which removes at least some vapor and droplets created by vaporization of the liquid in the plasma from an optical path between the plasma and the viewing port.

Another issue in SEGD apparatuses relates to unfocused light reaching the light collection unit reducing the effectiveness of the spectroscopic analysis of the light. Therefore, a second aspect of the present invention provides a plasma chamber having a lens configured to direct (and at least partially focus) light created in the plasma onto a receiving unit, configured to receive the light for spectroscopic analysis.

Figure 4:
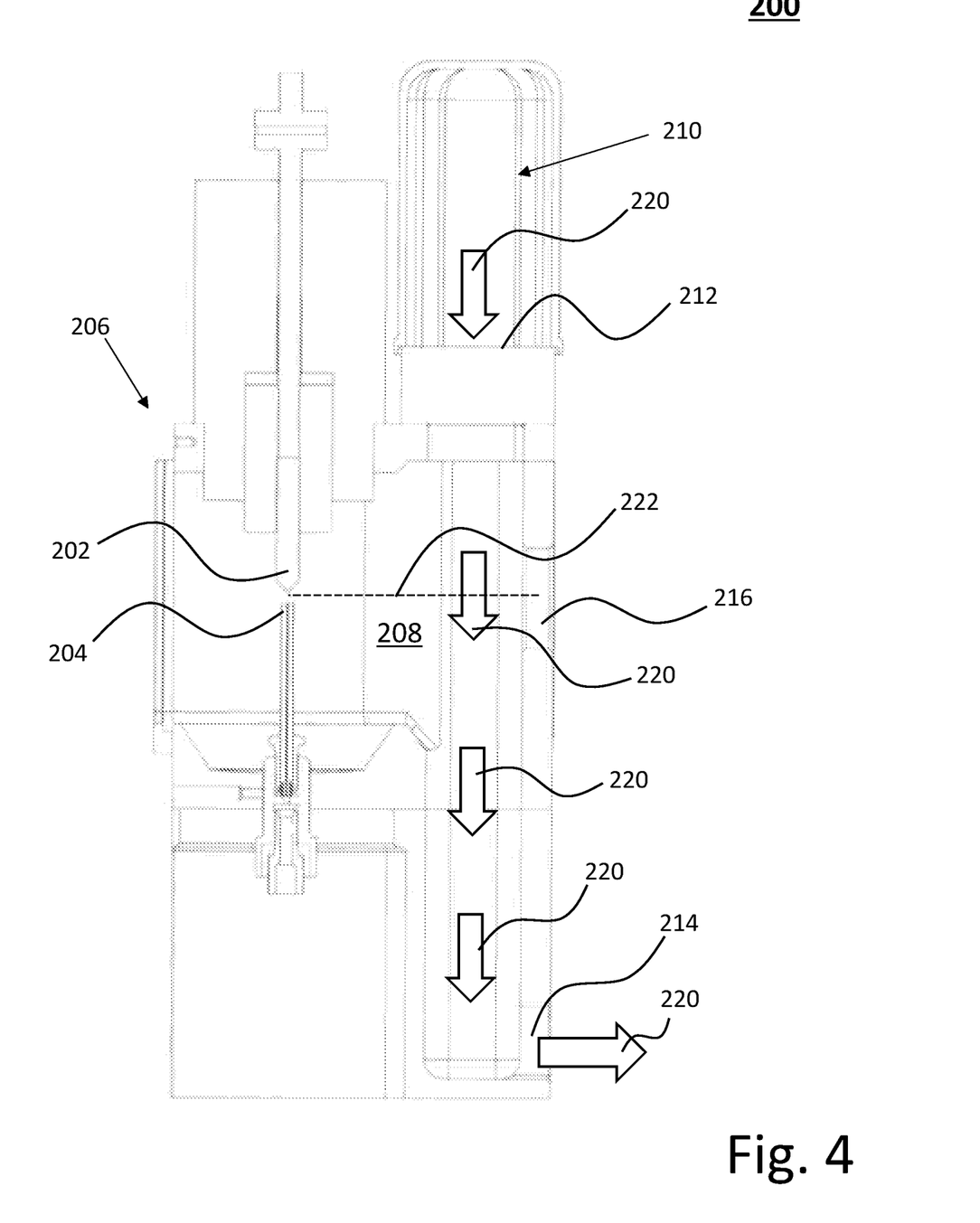
FIG. 4 is a side cross sectional view of a plasma chamber for a SEGD apparatus, having a vertical ventilation unit, according to some embodiments of the present invention.
Figure 5:
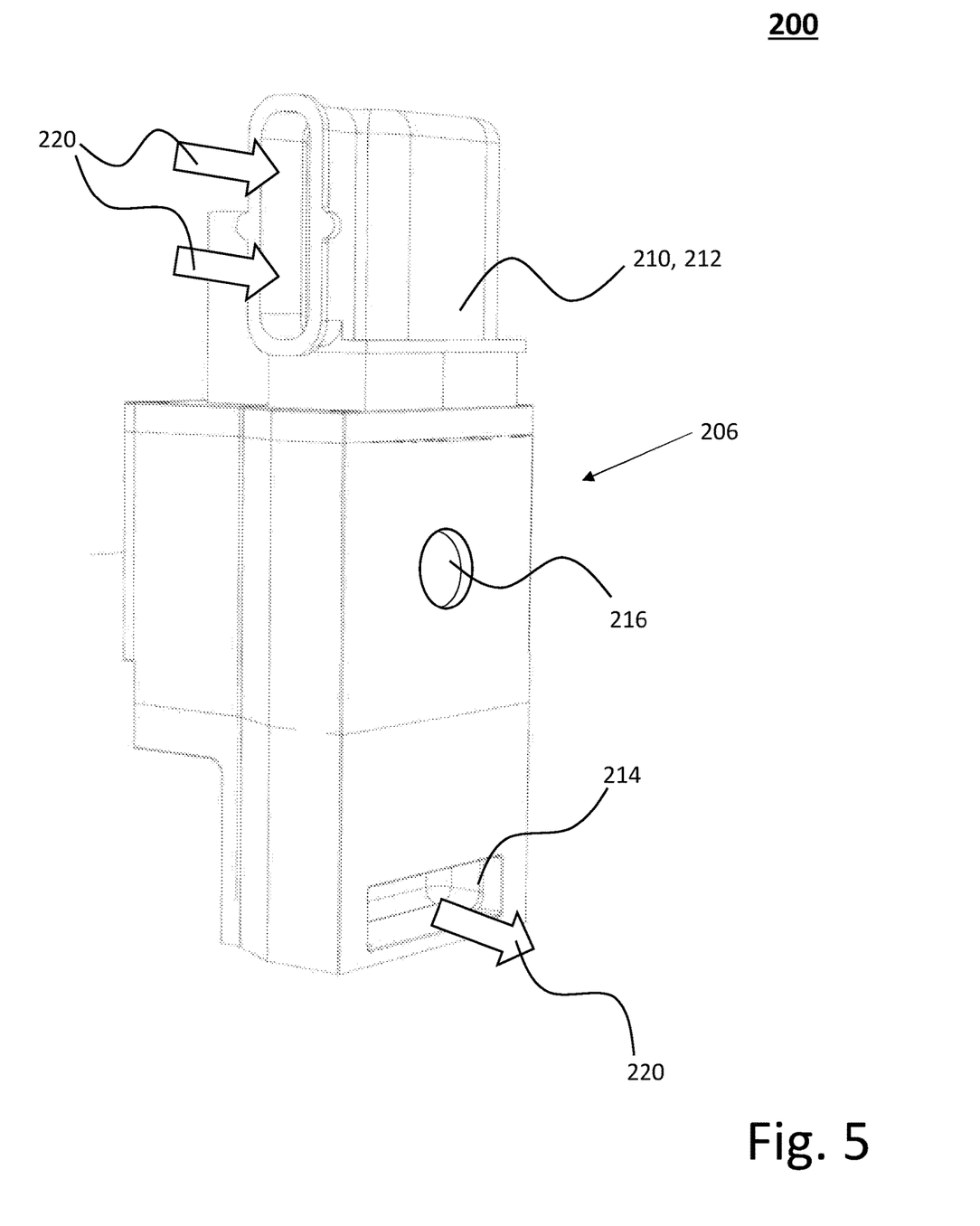
FIG. 5 is a perspective view of the plasma chamber of FIG. 4.

Referring now to the drawings, FIG. 4 is a side cross sectional view of a plasma chamber 206 for a SEGD apparatus 200, having a vertical ventilation unit, according to some embodiments of the present invention. FIG. 5 is a perspective view of the plasma chamber of FIG. 4.

The SEGD apparatus 200 includes a solid electrode 202 and a solution electrode 204, and plasma chamber 206 enclosing the solid electrode 202 and the solution electrode 204 and the plasma created in the gap between the solid electrode 202 and the solution electrode 204.

The solid electrode 202 and a solution electrode 204 are as described above, with reference to FIGS. 1 and 2. The solid electrode 202 may be an anode or cathode. If the solid electrode is an anode, the solution electrode is a cathode. If the solid electrode is a cathode, the solution electrode is an anode. It should be noted that in the example of FIG. 4, the solid electrode 202 is vertically above the solution electrode 204. However, the scope of the present invention extends to the case in which the solution electrode 204 is vertically above the solid electrode 202, and to the case in which the solid electrode 202 and the solution electrode 204 are disposed horizontally rather than vertically.

The plasma chamber 206 comprises a hollow body 208 and a ventilation unit 210. The hollow body 208 encloses the solid electrode 202 and the solution electrode 204 and has an inlet opening 212, an outlet opening 214, and at least one viewing port 216 for allowing light from the plasma to exit the hollow chamber.

The ventilation unit 210 includes means for moving air from outside the hollow body 208 into the hollow body 208 via the inlet opening 212, through a portion of the hollow body 208 located between the viewing port 216 and the gap between the solid electrode 202 and the solution electrode 204, and out of hollow body 208 from the outlet opening 214, as seen by the arrows 220 indicating the air flow created but the ventilation unit 210. In this manner, an air curtain is generated, which removes from the optical path 222 between the plasma and the viewing port 216 at least some vapor created by vaporization of liquid in the plasma.

Removal of the liquid vapor (which may be water vapor if the liquid is water) in the optical path 222 decreases the interference of the vapor with the light and allows better reception of the light for spectroscopic analysis.

The ventilation unit may include any type and any number of air moving units, such as a rotary fan or a solid state fan, for example. In the example of FIGS. 4 and 5, the air is moved vertically from top to bottom, with the inlet aperture 212 being above the viewing port 216, and the outlet aperture 214 being below the viewing port 216. The scope of the present invention extends to the embodiment in which air is moved vertically from bottom to top, with the inlet aperture below the outlet aperture.

The viewing port 216 may be a hollow opening or may be covered by a panel that is transparent to the light created by the plasma.

Figure 6A:
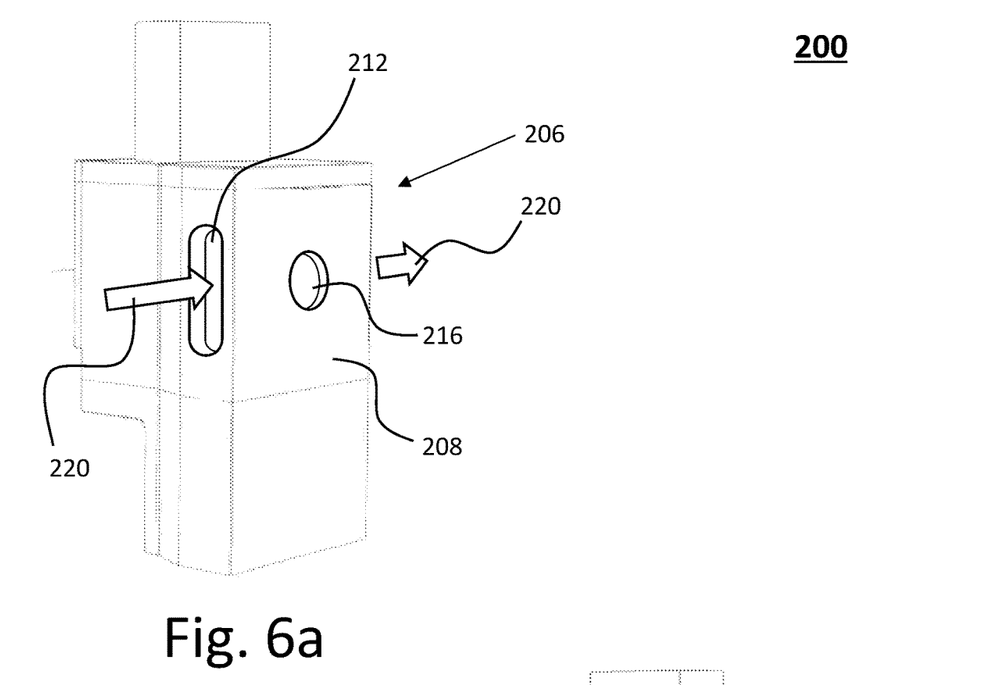
FIGS. 6a and 6b are perspective views of a plasma chamber having a horizontal ventilation unit, according to some embodiments of the present invention.
Figure 6B:
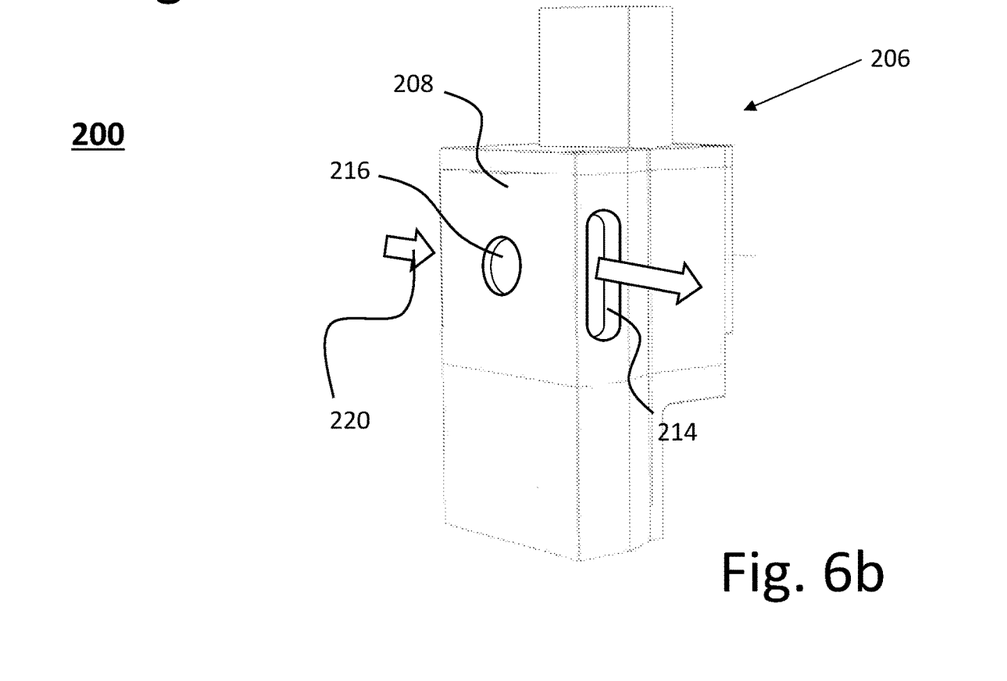

FIGS. 6a and 6b are perspective views of a plasma chamber having a horizontal ventilation unit, according to some embodiments of the present invention.

In the example of FIGS. 6a and 6b, the hollow body 208 of plasma chamber 206 has an inlet aperture 212 and an outlet aperture 214 that are located on opposite the sides of the hollow body and are horizontally aligned with the viewing port 216. The ventilation unit causes the air to travel sideway (horizontally) into the inlet aperture 212, through the optical path between the electrodes (or the plasma) and the viewing port 216, and out of the outlet aperture 214.

The scope of the present invention extends to the embodiment in which the inlet aperture, the outlet aperture, and the ventilation unit are configured to cause an diagonal airflow, as long as the airflow passes through the optical path between the electrodes (or the plasma) and the viewing port 216.

Figure 7:
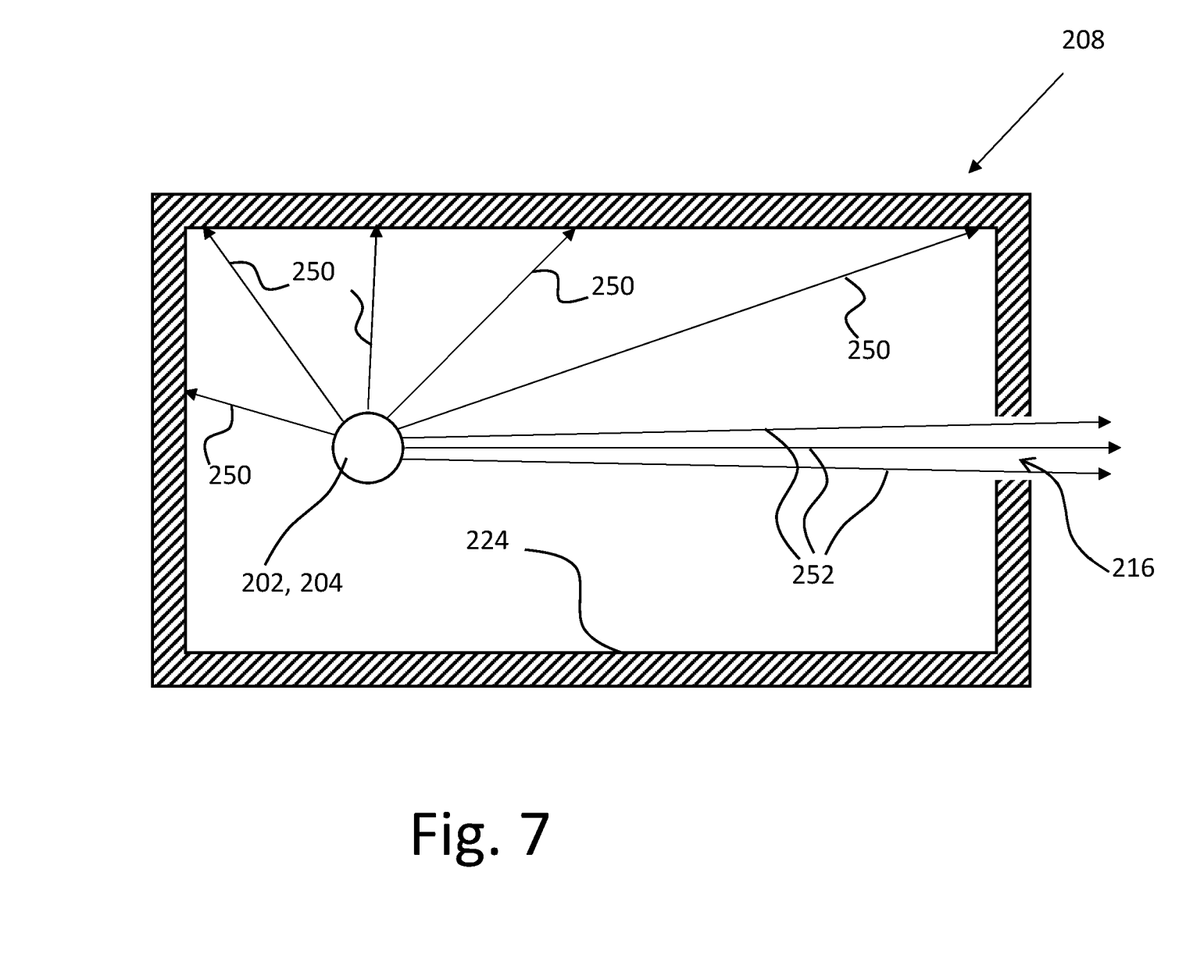
FIG. 7 is a top cross-sectional view of the hollow body, in which the hollow body is coated by a light-absorbing substance according to some embodiments, of the present invention.

As shown in FIG. 7, the internal portion of the hollow body 208 is coated by a substance 224. The substance may be light absorbing, to decrease reflections of the light generated by the plasma. The substance 224 may be sandblasted to increase the roughness of the substance's surface to decrease reflection. The plasma between the electrodes 202 and 204 generates light rays that travel radially outward from the plasma. The light rays 250 that strike the substance 224 are at least partially absorbed by the substance 224, so as to decrease reflection from the hollow body to the viewing port 216. The light rays 252 that travel directly from the plasma to the viewing port 216 exit the viewing port 216 and are analyzed by the spectrometer.

Figure 8:
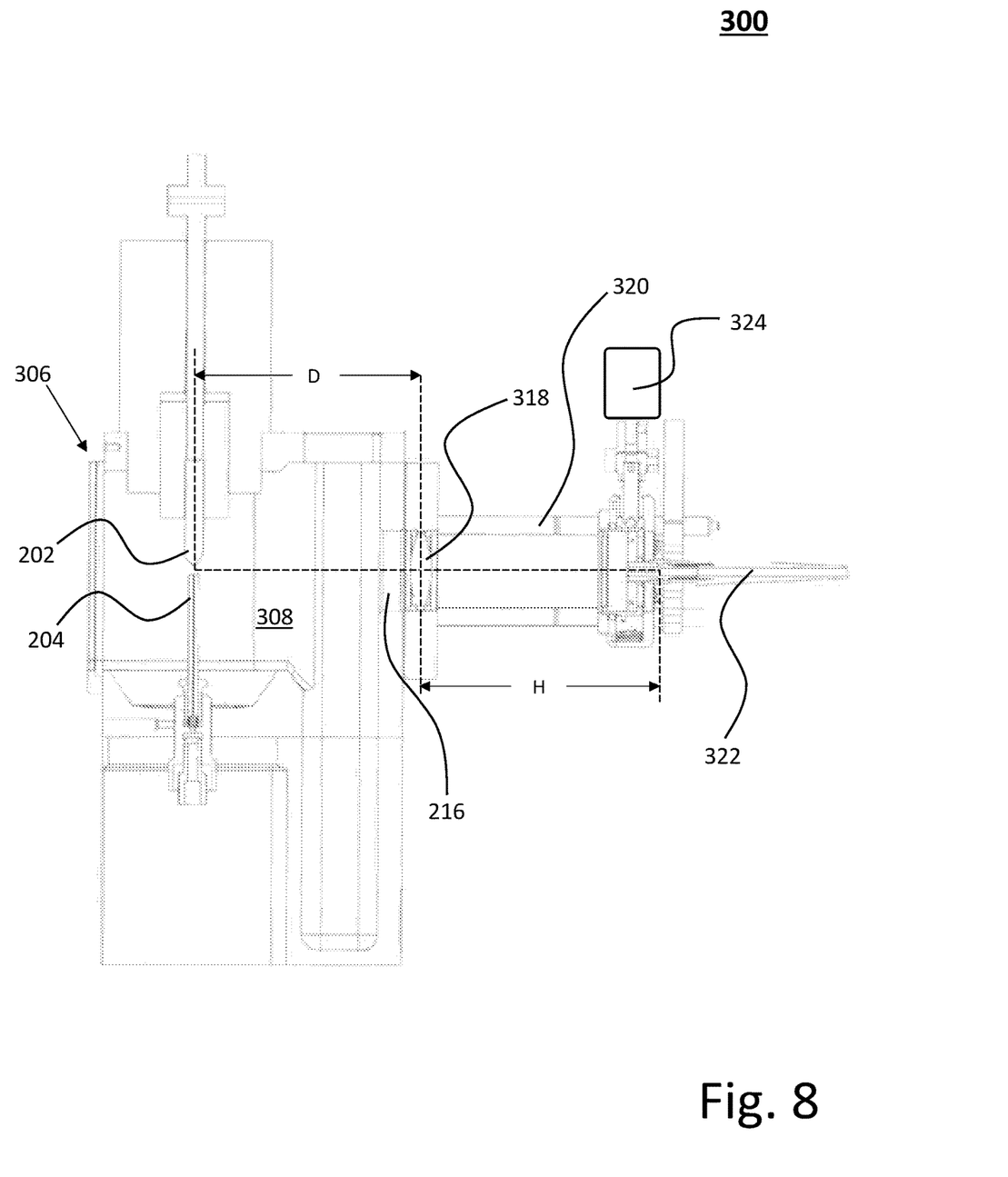
FIG. 8 is a side cross-sectional view of a plasma chamber for a SEGD apparatus, the plasma chamber comprising a lens configured to direct light created by the plasma onto a light receiving unit, according to some embodiments of the present invention.
Figure 9:
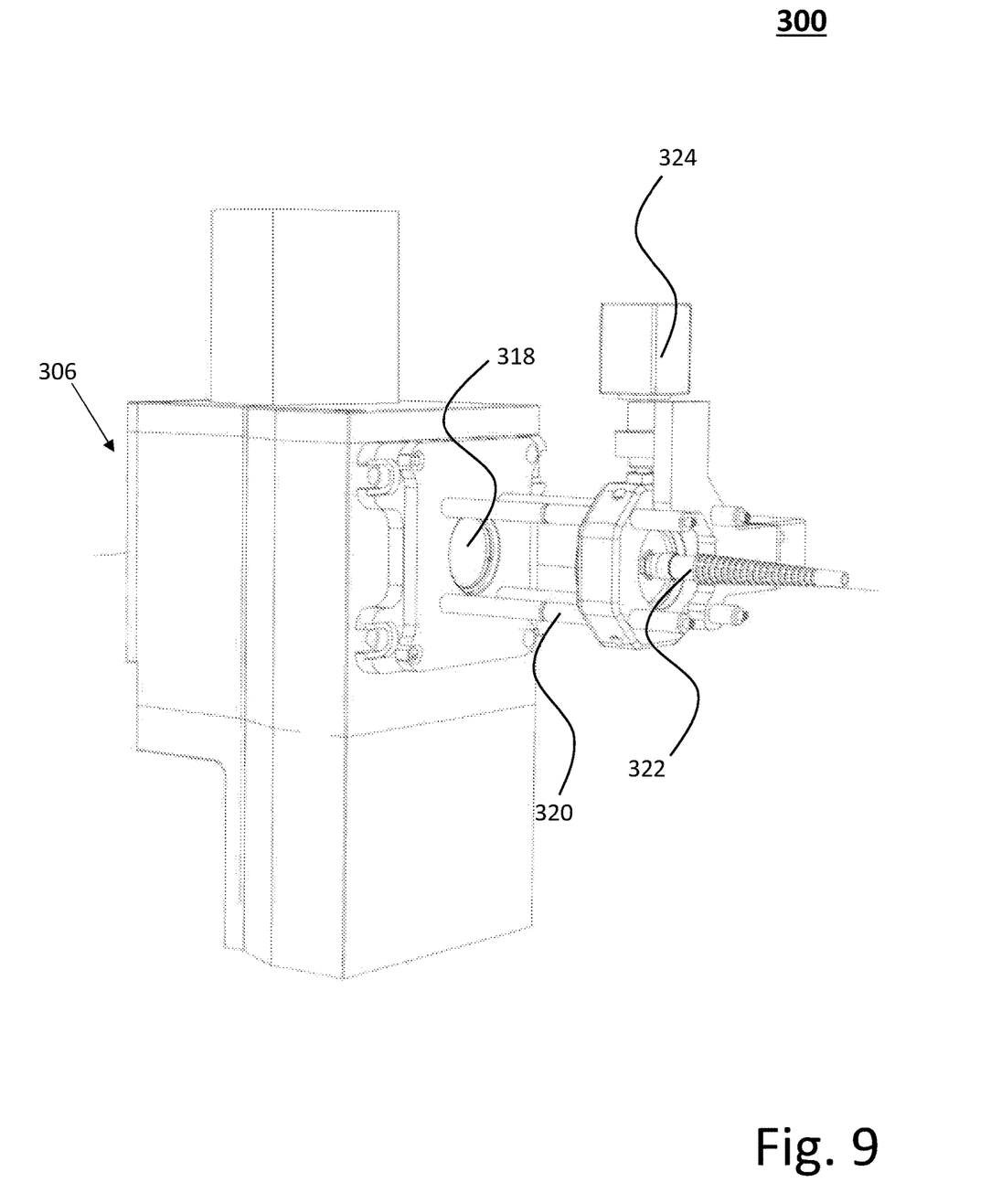
FIG. 9 is a perspective view of the plasma chamber of FIG. 8.

FIG. 8 is a side cross-sectional view of a plasma chamber 306 for a SEGD apparatus 300, the plasma chamber 306 comprising a lens 318 configured to direct light created by the plasma onto a light receiving unit 322, according to some embodiments of the present invention. FIG. 9 is a perspective view of the plasma chamber of FIG. 8.

The SEGD apparatus includes electrodes 202 and 204 (as described above), and a plasma chamber 206. The plasma chamber 206 includes a hollow body 306 (enclosing the electrodes 202 and 204 and having a viewing port 216) and a lens 318. The lens 318 is located at or near the viewing port 216. The lens is configured to collect light from the plasma and direct the light onto a light receiving unit 322. In some embodiments of the present invention, the lens 318 is integral with hollow body, so that the lens is always at the correct focal distance and position from the center of the gap between the electrodes 202 and 204 (the center of the plasma). The lens may fully cover the viewing port 216. The distance D between the lens 318 and the gap between the electrodes 202 and 204 is selected by a practitioner skilled in the art.

The plasma chamber 306 may include a holder 320 joined to the outside of the hollow body 308 and configured to hold the light receiving unit 322 at a predetermined distance H parallel to the lens' focal axis (horizontally in the example of FIG. 8) from the lens 318 and to move the light receiving unit 322 perpendicularly to the focal axis of the lens and parallel to the axis of the gap between the electrodes (vertically in the example of FIG. 8). In one example, the light receiving unit 322 may include a fiber optic cable configured to receive the light from the lens 318 and to direct the light to a spectrometer for analysis. In another example, the light receiving unit 322 comprises a spectrometer configured to receive and analyze the light from the lens 318.

In some embodiments of the present invention, the horizontal distance H between the light receiving unit 322 and the lens 318 is also chosen by a practitioner skilled in the art, to ensure that a desired portion of the collected light reaches the light receiving unit 322 to achieve a desired signal and accurate analysis of the light emitted by the plasma.

The holder 320 includes a moving unit 324 to move the light receiving unit 322 perpendicularly to the focal axis of the lens 318 and parallel to the axis of the gap between the electrodes 202 and 204. The moving unit 324 may include a stepper motor configured to dynamically and finely change the position of the light receiving unit 322. In some embodiments of the present invention, the moving unit 324 is further configured to move the receiving unit 322 perpendicularly to the focal axis of the lens 318 and perpendicularly to the axis of the gap between the electrodes 202 and 204.

The holder 320 may be reinforced to decrease vibrational variations in a position of the light receiving unit relative a center of the plasma.

It should be noted that in the prior art, separately mounted optics have been used to direct light to a spectrometer. However, the inventors have found that separately mounted optics are vulnerable to vibrational displacements. Therefore, in some embodiments of the present invention, the lens 318 and the holder 320 are integral with the hollow body 308.

It should be noted that besides relating to a fixed lens 318 and a moving holder 320, the scope of the present invention extends to the embodiment in which the lens 318 is movable and the holder 320 is fixed, and to the embodiment in which the lens 318 and the holder 320 are both independently movable. Thus, in general terms, the present scope of the present invention relates to a lens 318 and moving holder 320 movable relative to each other.

As explained above with reference to FIG. 7, an internal portion of the hollow body comprises a light absorbing material.

Figure 10A:
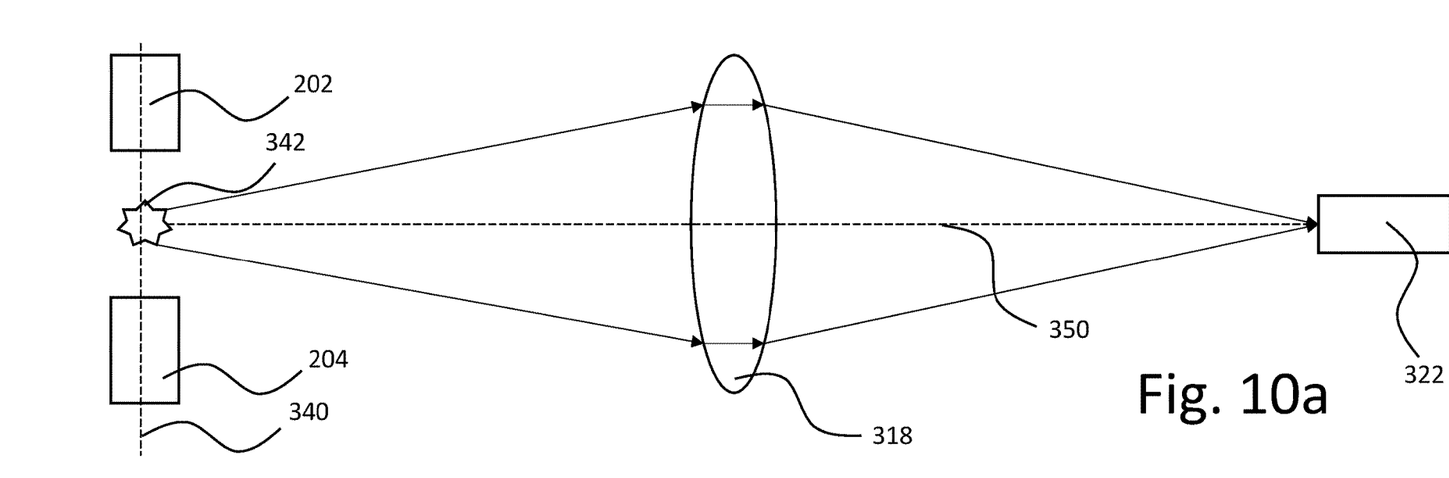
FIGS. 10a and 10b are schematic drawings illustrating different optical paths followed by light generated at different vertical locations in the gap between two electrodes of a SEGD apparatus.
Figure 10B:
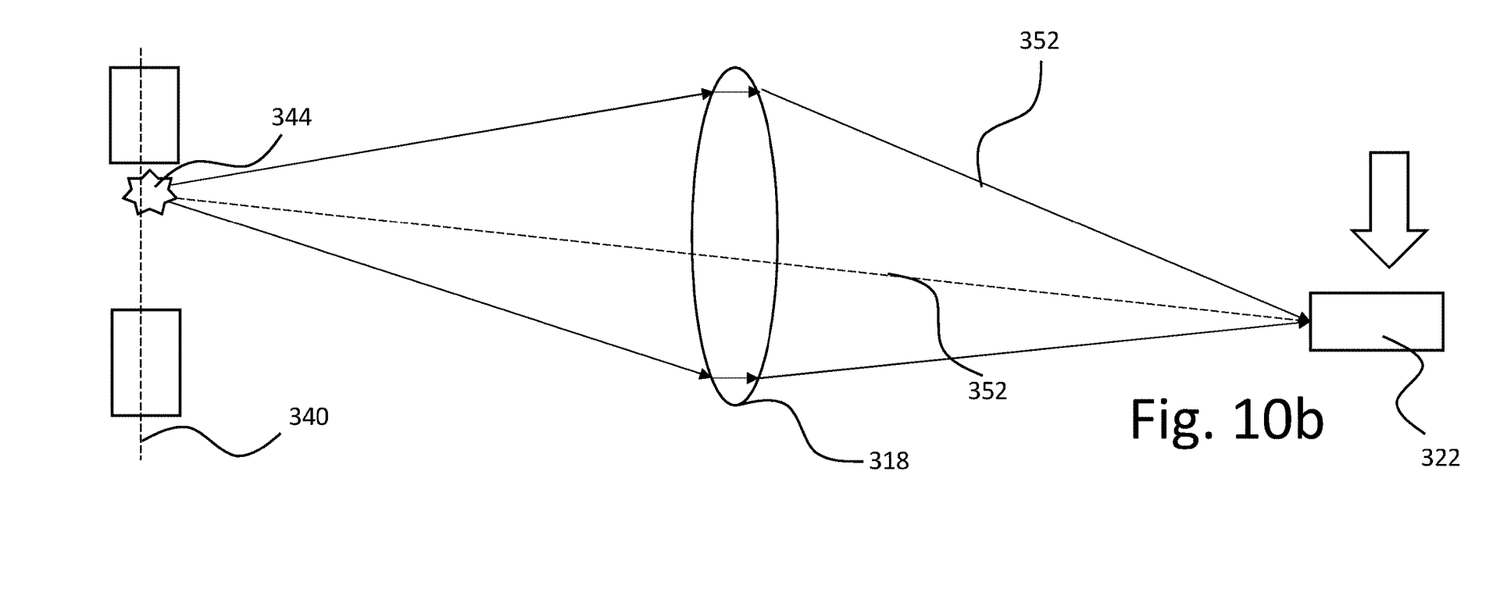

FIGS. 10a and 10b are schematic drawings illustrating different optical paths followed by light generated at different vertical locations in the gap between two electrodes of a SEGD apparatus.

In the plasma, some material elements rise higher that others, depending on various parameters, including (but not limited to) atomic weight and charge, energy levels, desolvation properties, hydride formation. Therefore, light from emitted from different materials emit light from different regions due to dynamics at play in the plasma. If the light receiving unit 322 were fixed, light collection for one element of interest would be collected. If multiple elements are of interest, a point would be chosen that is not optimal for any one point of interest, but is the best average, resulting in lower analytical sensitivity.

In the present invention, the holder 320 is able to move the light receiving unit 322 perpendicularly to focal axis of the lens 318 and parallel to the axis 340 of the gap between the electrodes 202 and 204.

In FIG. 10a, a first material 342 is located at the within the plasma and emits light that travels via a first optical path 350 to the light receiving unit 322 via the lens 318. The light receiving unit 322 is placed to receive the light along the first optical path.

In FIG. 10b, a second material 344 of interest is located at a location within the plasma that differs from the location of the first material 342 and the light emitted by the second material follows a second optical path 352 that is different than the first optical path 350. Therefore, the holder moves the light receiving unit 322 perpendicularly to the focal axis of the lens 318 and parallel the axis 340 between the electrodes 202 and 204, to meet the second optical path 352. Because the horizontal distance (i.e. the distance parallel to the optical axis of the lens) between the lens and the light receiving unit 322 has not changed, the lens directs the light on light receiving unit 322.

In some embodiments of the present invention, the holder is further configured to move the light receiving unit 322 parallel to the focal axis of the lens 318. This ensures that the light receiving unit 322 can be positioned at a location where most of the gathered light is directed by the lens 318. This motion enables to find the center of the gap between the electrodes 202 and 204, which may change over time, as the electrodes deteriorate.

Figure 11:
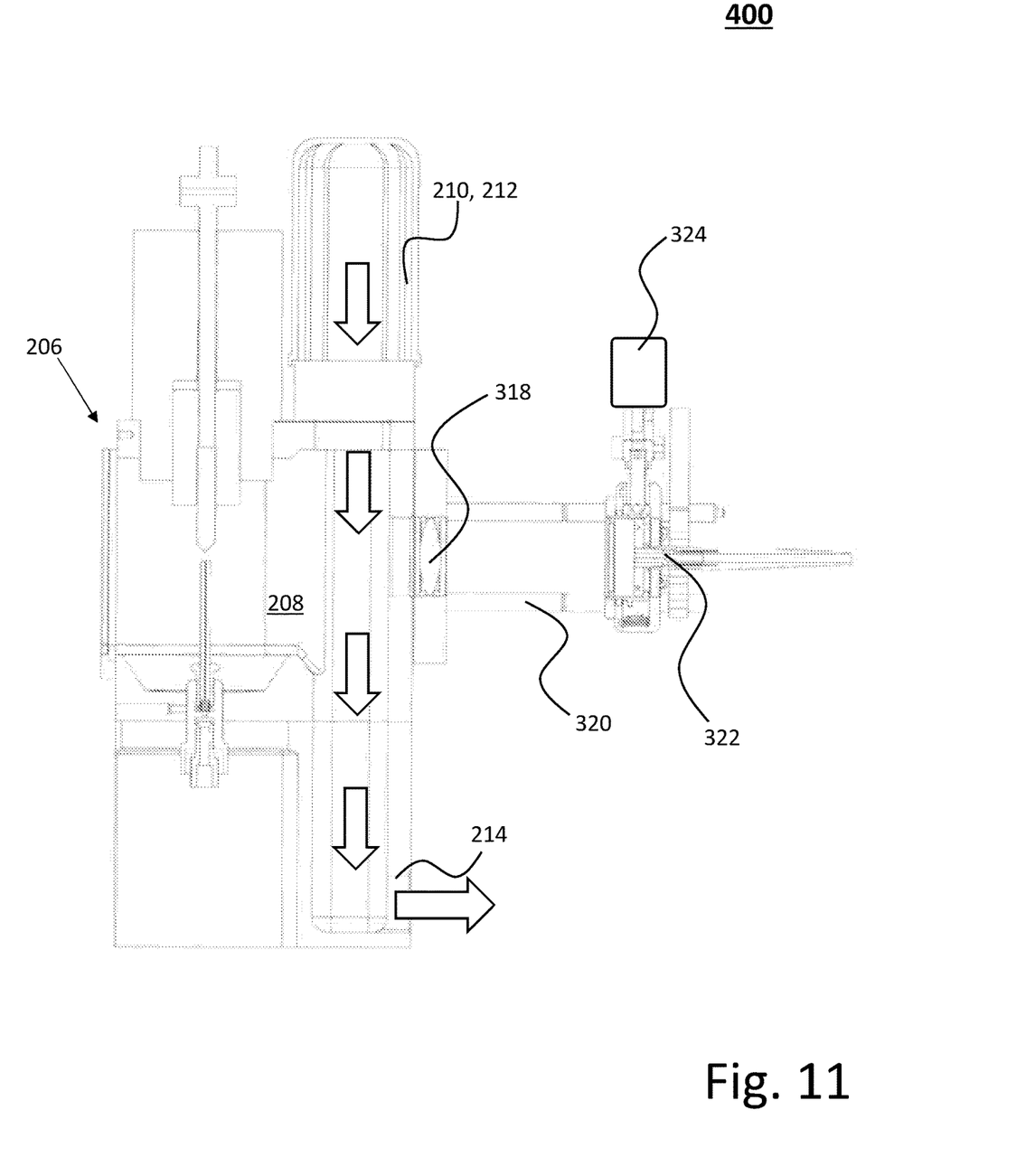
FIG. 11 is a side cross sectional view of a plasma chamber for a SEGD apparatus, having a vertical ventilation unit and a lens configured to direct light created by the plasma onto a light receiving unit, according to some embodiments of the present invention.
Figure 12:
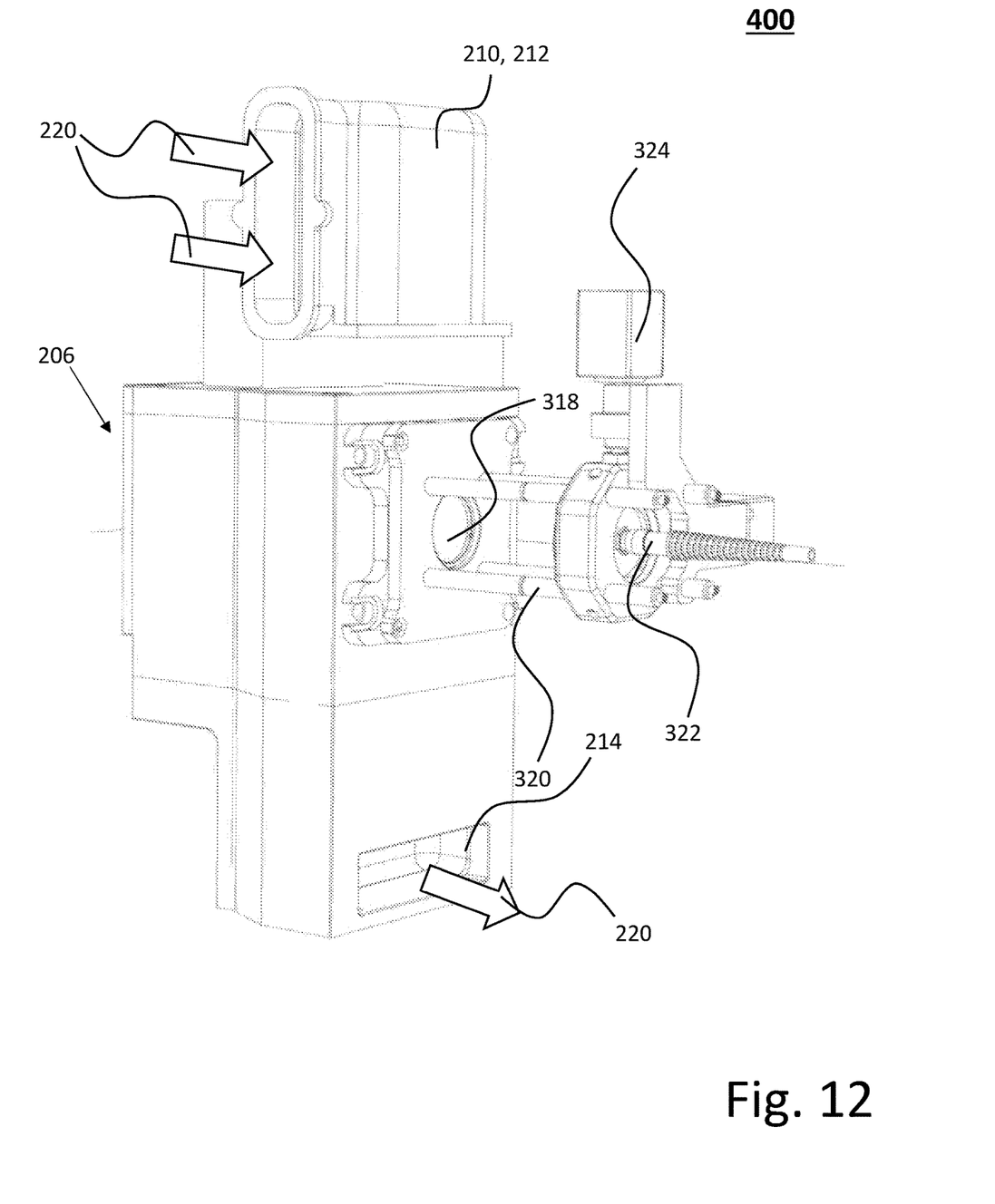
FIG. 12 is a perspective view of the plasma chamber of FIG. 11.

FIG. 11 is a side cross sectional view of a plasma chamber for a SEGD apparatus, having a vertical ventilation unit and a lens configured to direct light created by the plasma onto a light receiving unit, according to some embodiments of the present invention. FIG. 12 is a perspective view of the plasma chamber of FIG. 11.

The SEGD apparatus 400 includes all the features of the SEGD apparatus 200 of FIGS. 4-7 and of the apparatus 300 of FIGS. 8-12.

In the SEGD apparatus 400, the ventilation unit 210 creates the air curtain between the lens 318 and the electrodes 202 and 204, such that the air curtain diverts from the lens 310 at least some liquid droplets thrown out of the plasma toward the lens, thereby protecting the lens from splatter.

What is claimed is:

1. A plasma chamber for containing a solution electrode glow discharge (SEGD) apparatus, the plasma chamber comprising:
   a hollow body configured to enclose a plasma generated between a solid electrode and a solution electrode, the hollow body comprising an inlet opening, an outlet opening, and at least one viewing port for letting light generated from the plasma leave the hollow body;
   a ventilation unit configured to move air from outside the hollow body into the inlet, through a portion of the hollow body located between the viewing port and a gap between the solid electrode and the solution electrode, and out of hollow body from the outlet.

2. The plasma chamber of claim 1, wherein an internal portion of the hollow body comprises a light absorbing material.

3. The plasma chamber of claim 1, wherein one of the inlet opening and the outlet is above the observation port while another of the inlet opening and the outlet opening is below the observation port.

4. The plasma chamber of claim 1, wherein the observation port comprises a panel that is transparent to the light generated by the plasma.

5. A solution electrode glow discharge (SEGD) apparatus comprising:
   a solution electrode;
   a solid electrode; and
   a plasma chamber comprising:
      a hollow body configured to enclose a plasma generated between the solid electrode and the solution electrode, the hollow body comprising an inlet opening, an outlet opening, and at least one viewing port for letting light generated from the plasma leave the hollow body;
      a ventilation unit configured to move air from outside the hollow body into the inlet, through a portion of the hollow body located between the viewing port and a gap between the solid electrode and the solution electrode, and out of hollow body from the outlet.

6. The plasma chamber of claim 1, wherein the ventilation unit is configured to move air to create an air curtain for removal from an optical path between the plasma and the viewing port of at least some vapor created by vaporization of liquid in the plasma.

7. The solution electrode glow discharge (SEGD) apparatus of claim 5, wherein the ventilation unit is configured to move air to create an air curtain for removal from an optical path between the plasma and the viewing port of at least some vapor created by vaporization of liquid in the plasma.

8. The solution electrode glow discharge (SEGD) apparatus of claim 5, wherein an internal portion of the hollow body comprises a light absorbing material.

* * * * *